United States Patent [19]

Westphal et al.

[11] Patent Number: 4,612,082
[45] Date of Patent: Sep. 16, 1986

[54] ARSENIC CELL STABILIZATION VALVE FOR GALLIUM ARSENIDE IN-SITU COMPOUNDING

[75] Inventors: Glenn H. Westphal, Dallas; Jimmie B. Sherer, Greenville, both of Tex.

[73] Assignee: Texas Instruments Incorporated, Dallas, Tex.

[21] Appl. No.: 701,589

[22] Filed: Feb. 13, 1985

Related U.S. Application Data

[62] Division of Ser. No. 446,298, Dec. 2, 1982, Pat. No. 4,522,791.

[51] Int. Cl.$^4$ .............................................. C30B 15/00
[52] U.S. Cl. ..................................................... 156/607
[58] Field of Search ................ 156/607, 611, 617 SP, 156/DIG. 70; 422/249

[56] References Cited

U.S. PATENT DOCUMENTS 3,591,340 7/1971 Plaskett ..................... 156/DIG. 70

FOREIGN PATENT DOCUMENTS 754767 8/1956 United Kingdom ................ 422/249
1366532 9/1974 United Kingdom ................ 422/249

OTHER PUBLICATIONS

Pekarek, Czech. J. Phys., B20, 1970, pp. 857–858.
Puttbach, Abs., 5th Amer. Conf. on Crystal Growth, 7/19/81, p. 75.
Farges, Jl. of Crystal Growth, 59 (1982), pp. 665–668.
Bass, Jl. of Crystal Growth, 1968, pp. 286–289.

Primary Examiner—Hiram H. Bernstein
Attorney, Agent, or Firm—Carlton H. Hoel; James T. Comfort; Melvin Sharp

[57] ABSTRACT

A quartz arsenic cell having a stabilizing valve used to generate hot arsenic vapor which is flowed into liquid gallium, to provide a melt of liquid gallium arsenide from which a crystal can be pulled. The stabilizing valve prevents negative relative pressure from occurring in the quartz arsenic cell, and thus prevents the molten material from being sucked back up into the quartz arsenic cell.

4 Claims, 3 Drawing Figures

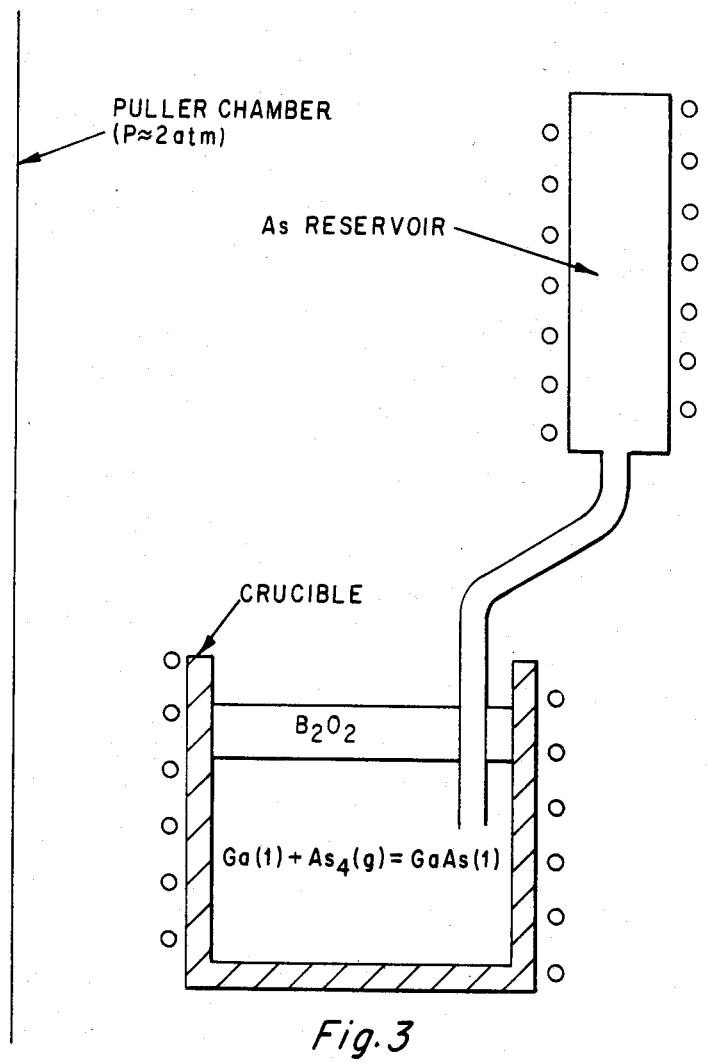

ARSENIC CELL STABILIZATION VALVE FOR GALLIUM ARSENIDE IN-SITU COMPOUNDING

This is a division, of application Ser. No. 446,298, filed 12/02/82, now U.S. Pat. No. 4,522,791, issued June 11, 1985.

BACKGROUND AND SUMMARY OF THE INVENTION

The present invention relates to preparation of monocrystalline compound semiconductors, particularly gallium arsenide.

To successfully grow large single crystals of GaAs by the liquid encapsulated Czochralski (LEC) technique, the GaAs starting material must first be compounded from elemental gallium and arsenic. The purest and most cost effective way to do this is to compound at low pressure in the crystal puller just prior to growth. See Pekarek, "Apparatus for Synthesis of Gallium Arsenide Under Liquid Encapsulant", Czech. J. Phys. B20 (1970), page 857, which is hereby incorporated by reference. The way this has been done at Texas Instruments is shown in FIG. 1. A radiatively heated quartz cell is used to force arsenic vapor through an injection tube into the liquid gallium melt, where it reacts chemically to form GaAs. The approach shown in the figure is very similar to that used by others in the industry, most notably Hewlett-Packard. See Puttbach et al, "Liquid Encapsulated Synthesis and Czochralski Growth of GaAs at Low Pressure", Fifth International Conference on Vapor Growth and Epitaxy (Coronado 1981), Abstracts p. 75. The disadvantage to this approach is that the pressure inside of the cell tends to drop below that outside of the cell at various times during the compounding cycle, and this can cause the liquid Ga and GaAs to be sucked up into the cell, ruining the run and creating a safety hazard. This can be avoided by using very high flux of arsenic, e.g. by externally heating the arsenic cell. However, a large flux of arsenic has two major disadvantages: first, the resulting high condensation of arsenic in the furnace chamber means that growth cannot occur in the same chamber where compounding has been done. This means that a transfer step is necessary, with large possibilities for contamination of the semiconductor material. Secondly, a very rapid introduction of the arsenic leads to poor control of melt composition, which leads to seriously degraded control over the crystal-growth process. Control is degraded since an unknown amount of escaped arsenic vapor will enter the chamber atmosphere and condense on the colder parts of the furnace chamber walls. Control of melt composition is important, since the melt must be about 2% arsenic-rich (or have a slightly larger excess of arsenic), if a stoichiometric crystal is to be pulled: if the melt is very much richer in arsenic, e.g. 5% excess arsenic or more, the crystal which is sought to be pulled will twin, or cannot be seeded, or will be pulled as polycrystalline material. If the melt has less than 2% atomic of arsenic, the crystals pulled will tend to be nonstoichiometric, and have a high concentration of arsenic vacancies. Thus, while the use of very high arsenic flux rate solves the suction problem, it also severely degrades control of the process generally.

Thus it is an object of the present invention to provide a method for compounding gallium arsenide in-situ immediately prior to crystal growth, in which good control of the melt composition is retained.

It is a further object of the present invention to provide a method for compounding gallium arsenide in-situ immediately prior to crystal growth, without introducing a large amount of arsenic into the chamber atmosphere.

It is a further object of the present invention to provide a method for compounding and growing semiconductor-grade gallium arsenide crystals, without requiring the compounded gallium arsenide to be exposed to the atmosphere prior to crystal growth.

The present invention has alleviated the suction problem by adding a stabilization valve to the cell as shown in FIG. 2. This valve prevents the pressure inside the cell from ever becoming less than that outside.

Thus, the primary object of the present invention is to permit in-situ compounding of gallium arsenide, as a preliminary to pulling a crystal of gallium arsenide, without the risk of introducing molten gallium or gallium arsenide into the arsenic chamber.

Introduction of the hot melt into the arsenic chamber is dangerous because the melt is many hundreds of degrees above the sublimation temperature of arsenic. Thus, essentially all the arsenic in the quartz cell will immediately vaporize. This rapid thermal vaporization is very likely to break the quartz arsenic cell, and dump the melt which has flowed up into the cell back down into the remaining melt in the crucible. The result of this is that gallium and gallium arsenide will be splashed all over the chamber, causing significant damage to the apparatus and necessitating a lengthy cleanup. Moreover, the sudden vaporization of much of the arsenic charge may even bring the internal pressure in the puller high enough that some arsenic vapor escapes into the atmosphere. Such arsenic vapor will immediately react to form arsenic trioxide dust, which is extremely poisonous.

According to the present invention there is provided: a system for compounding gallium arsenide, comprising: crucible means for holding a melt of gallium and gallium arsenide; an arsenic sublimation cell, said sublimation cell comprising an arsenic vapor injection tube downwardly extending from an upper portion of said arsenic cell; means for positioning said arsenic cell so that said arsenic vapor injection tube extends into the interior of said crucible; wherein said arsenic cell further comprises a stabilizing valve, said stabilizing valve comprising a ball check valve to prevent low relative pressure inside said arsenic cell.

BRIEF DESCRIPTION OF THE DRAWINGS

The present invention will be described with reference to the accompanying drawings wherein:

FIG. 3 shows a second type of in-situ compounding apparatus, using an externally-heated rather than radiatively-heated arsenic cell, in which the present invention can be incorporated.

DESCRIPTION OF THE PREFERRED EMBODIMENT

Figure 1:
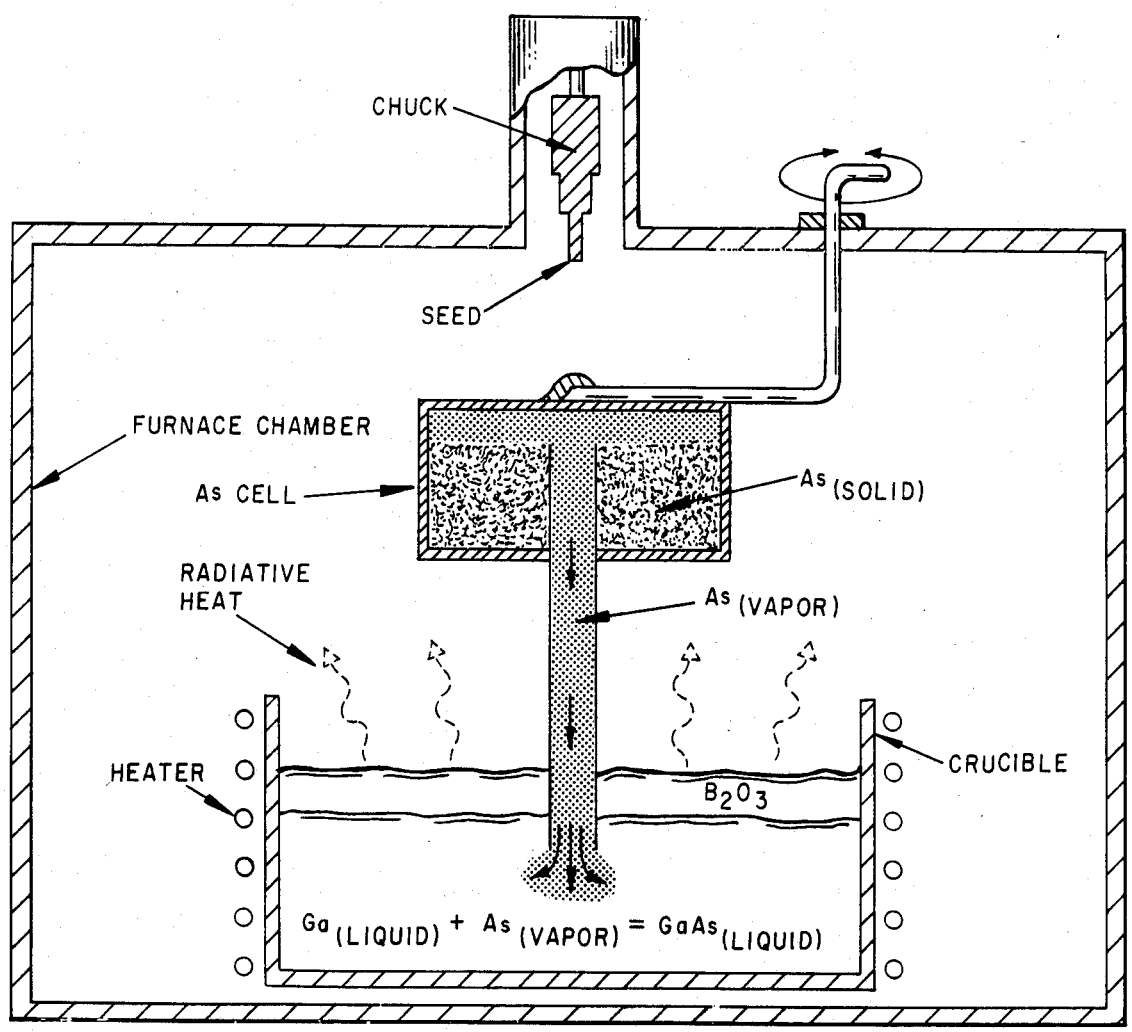
FIG. 1 shows schematically an apparatus, for in-situ compounding of gallium arsenide at a low pressure immediately prior to Czochralski growth, in which the improvement of the present invention can be incorporated.

FIG. 1 shows schematically the key elements of an apparatus for in-situ low pressure compounding of gallium arsenide prior to liquid encapsulated Czochralski growth of a monocrystalline gallium arsenide boule. The whole apparatus shown is normally encased in a furnace chamber, and a heating element (such as a resistance heater (preferred) or an induction coil) is provided around the melt. Initially, the arsenic cell is charged with lumps of solid arsenic, and the crucible is filled with metallic gallium. Of course, both starting elements must be of extremely high purity, to achieve the desired eventual purity. An encapsulant, such as boric oxide, is also loaded into the crucible. This encapsulant is required for the liquid-encapsulated Czochralski growth.

To begin the compounding process, the crucible is heated to melt the initial charge of gallium and boric oxide. This occurs at a low temperature, namely 29° C. for the gallium and 450° C. for the boric oxide. In the present case, where the arsenic is added relatively slowly, the heat generated by the exothermic reaction between gallium and arsenic is a minor perturbation. The exothermic nature of the reaction is of importance only if the reactants are initially put in intimate physical contact prior to reaction. As the reaction proceeds more heat must be supplied to the arsenic cell in order to heat the upper side (away from the direct radiation) above the sublimation point of arsenic (about 620° C.). In the presently preferred embodiment, this is achieved by lowering the cell closer to the melt. Usually the power input to the heater will not be changed during the compounding. The preferred procedure is to heat the gallium/boric oxide mixture to the melting point of gallium arsenide (about 1250° C.), bring the quartz cell into such a position such that the injection tube is in contact with the gallium, and then the cell/crucible combination is gradually lowered in the heater until all the arsenic has evaporated and reacted. In the presently preferred embodiment of the present invention, the initial charge of gallium is 708 g, the initial charge of arsenic is 777 g, and the arsenic is sublimed for compounding at a rate between zero and 10000 (preferably about 1500) grams per hour over the whole compounding cycle. However, the rate of sublimation can be allowed to change during the compounding cycle, if desired. Eventually, much larger runs would be desirable, to pull multi-kilogram crystals.

After compounding is essentially complete, the quartz arsenic cell is lifted from the melt and retracted, and the crystal pulling process can begin. The steps in the actual crystal pulling process are well known in the art of material science generally. Since the melting temperature of a gallium arsenide melt is somewhat variable with the exact composition of the melt, the melt is initially brought to a temperature which is slightly above the melting point of gallium arsenide, which is in the neighborhood of 1250° C. The seed lift mechanism is used to lower the seed until it comes in contact with the melt surface, and the temperature is gradually lowered until growth begins. The onset of crystal growth is easily determined visually by looking at the meniscus formed where the seed tip contacts the melt. That is, the melt surface (which is highly reflective) will be dimpled upward slightly to make contact with the edges of the seed. When the diameter of the meniscus increases, this indicates that crystal growth has begun, and controlled withdrawal of the seed, together with separate respective rotations of the seed and of the melt, are now used to pull a crystal from most of the mass of the melt. Preferably a slight nitrogen overpressure (e.g. 23 or more psi of nitrogen) is maintained in the chamber during compounding and growth, but any other non-reactive gas can be used.

Figure 2:
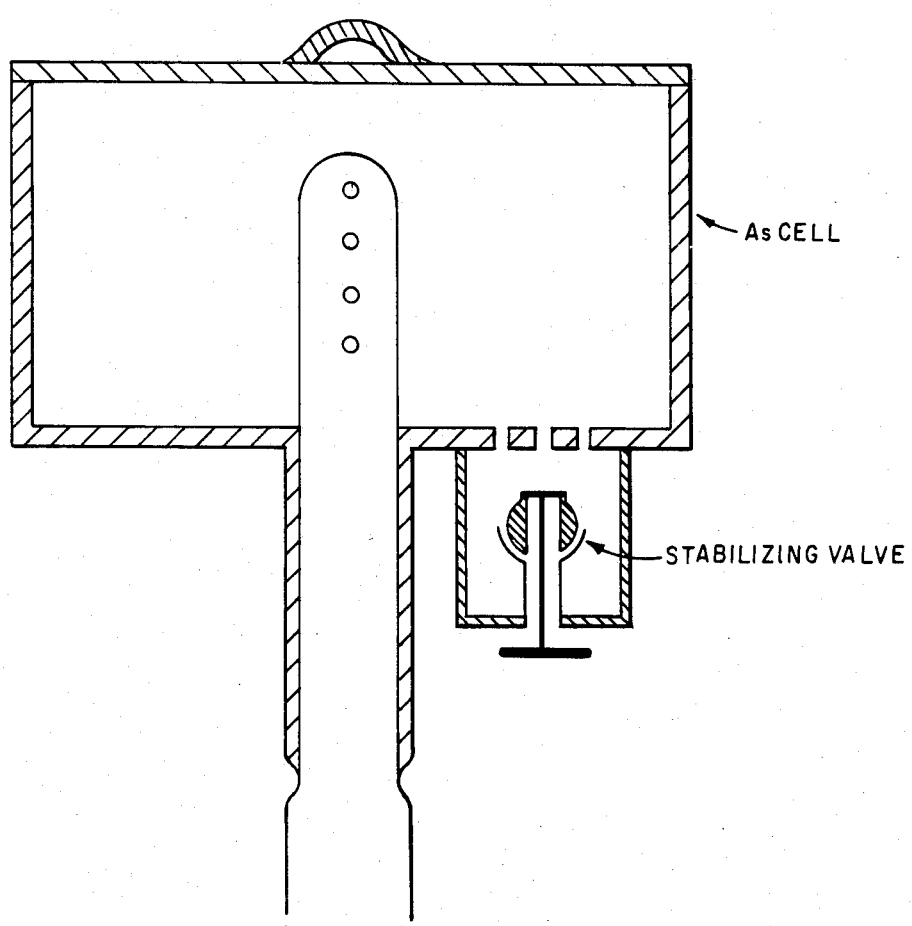
FIG. 2 shows an arsenic cell, as used in the apparatus of FIG. 1, which incorporates a stabilizing valve according to the present invention.

The present invention teaches an arsenic cell as shown in FIG. 2. This cell is also made of quartz, as in the prior art, but includes a stabilizing valve. This stabilizing valve is preferably made entirely of quartz, including the ball check and stem. Such quartz check valves are separately available off-the-shelf from commercial suppliers.

When this compounding cell is used, the materials processing proceeds as with a conventional apparatus, except that the chance of negative relative pressure in the arsenic cell, and of material being sucked up into the arsenic cell, is now completely avoided. Thus, the apparatus is safer and more reliable, and control of the compounding rate is much simpler. In the presently preferred embodiment, where the arsenic cell is sized to contain an original charge of 777 g of arsenic (in lumps which are roughly ¼" across), the stabilizing valve has an orifice 0.20" in diameter, with a ball check which is 0.375" in diameter. However, these dimensions are not at all critical. The entrance from the stabilizing valve to the arsenic compounding cell should, of course, have holes no larger than the minimum size of the granular arsenic use. However, this is not critical, since granular arsenic which falls into the body of the stabilizing valve will typically sublime first, since the stabilizing valve sees more radiant heating from the melt than the rest of the quartz arsenic cell does. The chosen size (weight) of the ball check itself is merely dependent on how far up the injection tube it is permissible to permit the melt to climb. The inside diameter of the arsenic injection tube is not particularly relevant, but, in the presently preferred embodiment, is about 21 mm.

Thus, this stabilizing valve has a very simple construction, suitable for high-temperature operation without introduction of impurities, and avoids a major safety hazard previously associated with gallium arsenide in-situ compounding. The present invention is not only applicable to gallium arsenide, but is also useful for other compound semiconductor materials where in-situ compounding is desired to be used.

The present invention is not solely applicable to compounding of gallium arsenide, but is also applicable to compounding of other compound semiconductors, where one of the elements is volatile. Thus, the present invention is of particular interest for compounding of phosphides, particularly gallium phosphide and indium phosphide. In-situ synthesis and growth of indium phosphide has recently been described in Farges, "A Method for the 'In-Situ' Synthesis and Growth of Indium Phosphide in a Czochralski Puller", 59 *Journal of Crystal Growth* 665 (1982), which is hereby incorporated by reference. That is, wherever compounding occurs by vaporization of a more volatile element in an enclosed cell and injection of that volatile element through an injection tube into a melt for compounding, the present invention teaches applying a check valve to the closed vaporization cell to prevent the occurrence of a local negative pressure condition in the vaporization cell. Other volatile elements from which it may be desired to compound semiconductors of interest include tellurium, sellenium, and sulfur. However, none of the II–VI compounds are nearly as interesting as gallium arsenide or indium phosphide. It is also, of course, not strictly necessary that the present invention be applied only to semiconductor materials, although it is in semiconductor materials that the desiderata of high purity, very accurate stoichiometry, and very good crystal quality are of primary importance.

In addition, the stabilization valve of the present invention is not only applicable to a compounding system as shown in FIG. 1, but can also be applied in other systems, such as that shown in FIG. 3. In the system of FIG. 3, the injection tube is slanted to offset the sublimation cell, so that the sublimation cell does not block the path of the seed for crystal pulling. Thus, in such an arrangement, the sublimation cell requires only a small degree of vertical travel, to withdraw the injection tube for the melt, or, if adequate temperature controls are available, the sublimation cell can be fixed in place. The advantage of such a system is that it is inherently better adapted for pulling large cyrstals, since nearly all of the width of the lower part of the puller chamber can be used for the crucible and liner. In all such systems, the crucible will typically be made of a strong refractory material, such as graphite, and a liner of a very inert material, such as quartz, will be inserted in the crucible.

In the presently preferred embodiment, a modification of puller such as a Hamco CG800 is used. This widely known puller has an upper chamber (the "pull chamber") which is separated from the lower chamber (the "furnace chamber") by a valve. Initially, the crucible (which is in the furnace chamber) is charged with Ga and $B_2O_3$ as discussed above, and on As cell according to the present invention is attached to the seed lift mechanism in place of the seed chuck. The As cell used in this embodiment is attached to a resistance heater. After both chambers are closed, evacuated, and backfilled with nitrogen, the crucible is heated, the valve is opened, the As cell is lowered until the injection tube tip is submerged in the melt, and the resistance heater on the As cell is turned on until the As is all sublimed. (This can be determined either by monitoring the weight of the cell, or by visually observing the melt surface.) The As cell is then retracted, and the valve between upper and lower chambers is closed. The As cell is then removed, and the seed chuck (with a seed) is remounted. After the upper chamber is evacuated and backfilled, the valve is opened, the seed is lowered, and growth proceeds as described above.

The preferred way to fill the As cell uses a removable center insert. The cell is held upside down and charged with As chunks, and then a perforated insert is emplaced and crimped in the arsenic vapor injection tube. However, many other expedients will serve to prevent As chunks from falling through the injection tube into the melt.

It will be apparent to those skilled in the art that the present invention may be practiced in a wide range of modifications and variations, such as other types of check valves may also be used in place of the ball check valve illustrated, and the invention is accordingly not limited except as specified in the accompanying claims.

What is claimed is:

1. A method of growing single crystals of a compound semiconductor, wherein one element of said compound semiconductor is more volatile and wherein another element of said compound semiconductor is less volatile, comprising the steps of:
   measuring a predetermined amount of said less volatile element into a crucible, a sublimation cell including a vapor injection tube downwardly extending from said sublimation cell;
   measuring a predetermined amount of said more volatile element into said sublimation cell, said respective predetermined amounts being selected to achieve a desired ratio of said volatile element to said nonvolatile element in a melt;
   heating said crucible, to melt said less volatile element;
   immersing said injection tube in said melt of said less volatile element; and
   heating said sublimation cell, so that said volatile element passes into said melt in the vapor phase and is compounded with said less volatile element in said melt;
   wherein said sublimation cell further comprises a check valve connected to prevent the interior of said sublimation cell from having a lower pressure than the exterior of said sublimation cell.

2. The method of claim 1, wherein said sublimation cell is heated until all of said predetermined amount of said more volatile element is vaporized.

3. The method of claim 1, further comprising the subsequent step of pulling a crystal of said compound semiconductor from said melt.

4. The method of claim 1, wherein said sublimation cell is heated to sublime said more volatile element at a rate of less than 3000 grams per hour.

* * * * *